(12) United States Patent
Qian

(10) Patent No.: US 9,478,640 B2
(45) Date of Patent: Oct. 25, 2016

(54) LDMOS DEVICE WITH STEP-LIKE DRIFT REGION AND FABRICATION METHOD THEREOF

(71) Applicant: SHANGHAI HUA HONG NEC ELECTRONICS CO., LTD, Shanghai (CN)

(72) Inventor: Wensheng Qian, Shanghai (CN)

(73) Assignee: SHANGHAI HUA HONG NEC ELECTRONICS CO., LTD., Shanghai (CN)

( * ) Notice: Subject to any disclaimer, the term of this patent is extended or adjusted under 35 U.S.C. 154(b) by 123 days.

(21) Appl. No.: 13/970,050

(22) Filed: Aug. 19, 2013

(65) Prior Publication Data

US 2014/0048879 A1    Feb. 20, 2014

(30) Foreign Application Priority Data

Aug. 20, 2012  (CN) .......................... 2012 1 0297088

(51) Int. Cl.
| | |
|---|---|
| *H01L 29/06* | (2006.01) |
| *H01L 29/66* | (2006.01) |
| *H01L 29/78* | (2006.01) |
| *H01L 29/08* | (2006.01) |

(52) U.S. Cl.
CPC ..... *H01L 29/66681* (2013.01); *H01L 29/0634* (2013.01); *H01L 29/66659* (2013.01); *H01L 29/66689* (2013.01); *H01L 29/7816* (2013.01); *H01L 29/7835* (2013.01); *H01L 29/0615* (2013.01); *H01L 29/0873* (2013.01); *H01L 29/0878* (2013.01); *H01L 29/0882* (2013.01); *H01L 29/0886* (2013.01)

(58) Field of Classification Search
CPC .......... H01L 29/0873; H01L 29/0878; H01L 29/0882; H01L 29/0886; H01L 29/66681; H01L 29/7816–29/7826; H01L 29/0615; H01L 29/0634

See application file for complete search history.

(56) References Cited

U.S. PATENT DOCUMENTS

| | | | |
|---|---|---|---|
| 2003/0193067 A1* | 10/2003 | Kim et al. | 257/343 |
| 2010/0148255 A1* | 6/2010 | Fuernhammer et al. | 257/342 |
| 2010/0295125 A1* | 11/2010 | Ito | 257/339 |

* cited by examiner

*Primary Examiner* — Tucker J Wright
*Assistant Examiner* — Mark Hatzilambrou
(74) *Attorney, Agent, or Firm* — MKG, LLC

(57) ABSTRACT

An LDMOS device is disclosed. The LDMOS device includes: a substrate having a first type of conductivity; a drift region having a second type of conductivity and a doped region having the first type of conductivity both formed in the substrate; a drain region having the second type of conductivity and being formed in the drift region, the drain region being located at an end of the drift region farther from the doped region; and a buried layer having the first type of conductivity and being formed in the drift region, the buried layer being in close proximity to the drain region and having a step-like bottom surface, and wherein a depth of the buried layer decreases progressively in a direction from the drain region to the doped region. A method of fabricating LDMOS device is also disclosed.

5 Claims, 5 Drawing Sheets

LDMOS DEVICE WITH STEP-LIKE DRIFT REGION AND FABRICATION METHOD THEREOF

CROSS-REFERENCES TO RELATED APPLICATIONS

This application claims the priority of Chinese patent application number 201210297088.9, filed on Aug. 20, 2012, the entire contents of which are incorporated herein by reference.

TECHNICAL FIELD

The present invention relates in general to laterally diffused metal oxide semiconductor (LDMOS) devices, and more particularly, to an LDMOS device with a step-like drift region and a fabrication method thereof.

BACKGROUND

Laterally diffused metal oxide semiconductor (LDMOS) transistors are often used as power switch devices.

FIG. 1a is a schematic illustration of an existing n-type LDMOS device. The device includes a p-type doped region 11 and an n-type drift region 12, laterally neighboring each other and both formed in a p-type substrate (or epitaxial layer) 10. The n-type drift region 12 has a planar top surface. A heavily doped n-type source region 19 is formed in a central portion of the p-type doped region 11. A gate oxide layer 13 has its one end on the n-type drift region 12, the other end on the heavily doped n-type source region 19, and the rest portion on the p-type doped region 11. A gate 14 is located on the gate oxide layer 13. Sidewalls 15 are formed on both sides of the gate oxide layer 13 and the gate 14. A heavily doped n-type drain region 20 is formed at one end of the n-type drift region 12 farther from the p-type doped region 11. A p-type heavily doped pick-up region 21 is formed at one end of the p-type doped region 11 farther from the n-type drift region 12. A channel of the LDMOS device is formed in a portion of the p-type doped region 11 under the gate oxide layer 13. A p-type LDMOS device has a similar architecture to the n-type LDMOS device discussed above expect that all components of the p-type LDMOS device have conductivity types opposite to their counterparts in the n-type LDMOS device.

The n-type LDMOS device in FIG. 1a may be modified into a p-type LDMOS device by including an n-type well in the p-type substrate (epitaxial layer) 10, encircling both an n-type doped region 11' and a p-type drift region 12', and converting the conductivity types of all the rest components of the n-type LDMOS device to respective opposite types of conductivity.

The above-mentioned device is a non-channel-isolated LDMOS device, which may be modified into a channel-isolated n-type LDMOS device by including an n-type well in the p-type substrate (epitaxial layer) 10, encircling both the p-type doped region 11 and the n-type drift region 12, and remaining the same structure and conductivity type of all the rest components of the n-type LDMOS device shown in FIG. 1a.

In order to reduce power consumption, an LDMOS device is typically required to have an on-resistance as low as possible. Thus, during the design of the device, it is contemplated to reduce the physical length of the drift region (i.e., the length A shown in FIG. 1a) to a possible minimum and/or to increase the doping concentration of the drift region, so as to reduce the series resistance of the drift region. However, on the other hand, as all LDMOS devices are high-voltage devices and the value of the breakdown voltage is an important characteristic parameter, the LDMOS devices are also required to have a high breakdown voltage by owning a relatively great drift region length and a low drift region doping concentration. Thus, it is obvious that the on-resistance and the breakdown voltage have to be compromised. It is difficult for an existing LDMOS device to have both a low on-resistance and a high breakdown voltage.

SUMMARY OF THE INVENTION

The present invention is directed to the provision of an LDMOS device with a completely novel structure, which is capable of providing both a low on-resistance and a high breakdown voltage.

The present invention provides an LDMOS device including: a substrate having a first type of conductivity; a drift region having a second type of conductivity and being formed in the substrate; a doped region having the first type of conductivity and being formed in the substrate, the doped region being laterally adjacent to the drift region; and a drain region having the second type of conductivity and being formed in the drift region, the drain region being located at an end of the drift region farther from the doped region; and a buried layer having the first type of conductivity and being formed in the drift region, the buried layer being in close proximity to the drain region and having a step-like bottom surface, and wherein a depth of the buried layer decreases progressively in a direction from the drain region to the doped region.

Optionally, the first and second types of conductivity are p-type and n-type, respectively, or n-type and p-type, respectively.

Optionally, a doping concentration of the drift region is inversely proportional to a length of the buried layer and is proportional to a depth of the buried layer.

Optionally, a maximum depth of the buried layer is determined by a doping concentration of the drift region.

Optionally, the buried layer comprises at least two ion implantation regions and wherein a depth of the at least two ion implantation regions decreases progressively in a direction from the drain region to the doped region.

Optionally, the LDMOS device further includes: a gate oxide layer and a polysilicon gate both on a top surface of the substrate, the gate oxide layer covering a portion of the drift region and a portion of the doped region; sidewalls on both sides of the gate oxide layer and the polysilicon gate; and a heavily doped source region having the second type of conductivity and a heavily doped channel pick-up region having the first type of conductivity both formed in the doped region, the heavily doped channel pick-up region being located at an end of the source region farther from the drift region.

The present invention also provides a method of fabricating an LDMOS device, including the steps of: providing a substrate having a first type of conductivity; forming a drift region having a second type of conductivity in the substrate; forming a doped region having the first type of conductivity in the substrate, the doped region being laterally adjacent to the drift region; forming a drain region having the second type of conductivity in the drift region, the drain region being located at an end of the drift region farther from the doped region; and forming a buried layer having the first type of conductivity in the drift region, the buried layer being in close proximity to the drain region and having a step-like bottom surface, and wherein a depth of the buried layer decreases progressively in a direction from the drain region to the doped region, wherein the first and second types of conductivity are p-type and n-type, respectively, or n-type and p-type, respectively.

Optionally, the method may include the steps of: 1) forming, in a substrate having the first type of conductivity, a doped region having the first type of conductivity and a drift region having the second type of conductivity which are laterally adjacent to each other; 2) successively forming a gate oxide layer and a polysilicon gate on a top surface of the substrate, the gate oxide layer covering a portion of the drift region and a portion of the doped region; 3) forming sidewalls on both sides of the gate oxide layer and the polysilicon gate; 4) performing at least two ion implantation processes at an end of the drift region farther from the doped region to form a buried layer having the first type of conductivity with a depth decreasing progressively in a direction from the drain region to the doped region; 5) forming a heavily doped source region having the second type of conductivity in a central portion of the doped region and forming a heavily doped drain region having the second type of conductivity at an end of the drift region farther from the doped region; and 6) forming a heavily doped channel pick-up region having the first type of conductivity at an end of the doped region farther from the drift region.

Optionally, in the step 4), each of the at least two ion implantation processes forms an ion implantation region in the drift region, wherein the ion implantation region formed by a latter ion implantation process is located in the ion implantation region formed by a former ion implantation process, and wherein the ion implantation region formed by a latter ion implantation process has a length smaller than and a depth greater than a length and a depth of the ion implantation region formed by a former ion implantation process.

Optionally, in the step 4), each of the at least two ion implantation processes forms an ion implantation region in the drift region, wherein the ion implantation region formed by a latter ion implantation process is closer to the doped region and in close proximity to the ion implantation region formed by a former ion implantation process, and wherein the ion implantation region formed by a latter ion implantation process has a depth smaller than a depth of the ion implantation region formed by a former ion implantation process.

Optionally, in the step 1), multiple ion implantation and annealing processes may be carried out to create a dopant concentration gradient in the drift region decreasing from the top down.

Optionally, the method may further include forming a well having a second type of conductivity in the substrate before the step 1), and in the step 1), the doped region having the first type of conductivity and the drift region having the second type of conductivity are both formed in the well.

Optionally, the drift region may have a dopant concentration ranged from $1\times10^{16}$ atoms/cm$^3$ to $1\times10^{18}$ atoms/cm$^3$, and both the heavily doped source region and the heavily doped drain region have a dopant concentration of greater than $1\times10^{20}$ atoms/cm$^3$.

The present invention also provides another method of fabricating an LDMOS device, including the steps of: providing a substrate having a first type of conductivity; forming a well having a second type of conductivity in the substrate; forming a drift region having the first type of conductivity in the substrate; forming a doped region having the second type of conductivity in the substrate, the doped region being laterally adjacent to the drift region; forming a drain region having the first type of conductivity in the drift region, the drain region being located at an end of the drift region farther from the doped region; and forming a buried layer having the second type of conductivity in the drift region, the buried layer being in close proximity to the drain region and having a step-like bottom surface, and wherein a depth of the buried layer decreases progressively in a direction from the drain region to the doped region, wherein the first and second types of conductivity are p-type and n-type, respectively, or n-type and p-type, respectively.

Optionally, the method may include the steps of: 1) forming, in a substrate having the first type of conductivity, a well having the second type of conductivity by performing an ion implantation process; 2) forming, in the well having the second type of conductivity, a doped region having the second type of conductivity and a drift region having the first type of conductivity which are laterally adjacent to each other; 3) successively forming a gate oxide layer and a polysilicon gate on a top surface of the substrate, the gate oxide layer covering a portion of the drift region and a portion of the doped region; 4) forming sidewalls on both sides of the gate oxide layer and the polysilicon gate; 5) performing at least two ion implantation processes at an end of the drift region farther from the doped region to form a buried layer having the second type of conductivity with a depth decreasing progressively in a direction from the drain region to the doped region; 6) forming a heavily doped source region having the first type of conductivity in a central portion of the doped region and forming a heavily doped drain region having the first type of conductivity at an end of the drift region farther from the doped region; and 7) forming a heavily doped channel pick-up region having the second type of conductivity at an end of the doped region farther from the drift region.

Optionally, in the step 5), each of the at least two ion implantation processes forms an ion implantation region in the drift region, wherein the ion implantation region formed by a latter ion implantation process is located in the ion implantation region formed by a former ion implantation process, and wherein the ion implantation region formed by a latter ion implantation process has a length smaller than and a depth greater than a length and a depth of the ion implantation region formed by a former ion implantation process.

Optionally, in the step 5), each of the at least two ion implantation processes forms an ion implantation region in the drift region, wherein the ion implantation region formed by a latter ion implantation process is closer to the doped region and in close proximity to the ion implantation region formed by a former ion implantation process, and wherein the ion implantation region formed by a latter ion implantation process has a depth smaller than a depth of the ion implantation region formed by a former ion implantation process.

Optionally, in the step 2), multiple ion implantation and annealing processes may be carried out to create a dopant concentration gradient in the drift region decreasing from the top down.

Optionally, the drift region may have a dopant concentration ranged from $1\times10^{16}$ atoms/cm$^3$ to $1\times10^{18}$ atoms/cm$^3$, and both the heavily doped source region and the heavily doped drain region have a dopant concentration of greater than $1\times10^{20}$ atoms/cm$^3$.

As the drift region of the LDMOS device of the present invention has a thickness progressively decreasing from the channel (which is under the gate oxide layer) towards the drain region due to the formation of a buried layer having a step-like bottom surface beneath the surface of the drift region, the drift region is easier to be completely depleted and hence can withstand a higher breakdown voltage. Meanwhile, the progressively decreasing thickness also allows an increase of the doping concentration of the drift region, thereby greatly reducing its on-resistance. Thus, the LDMOS device of the present invention can have both a low on-resistance and a high breakdown voltage, and therefore has an improved performance compared with the existing device.

DETAILED DESCRIPTION OF THE INVENTION

Figure 1A:
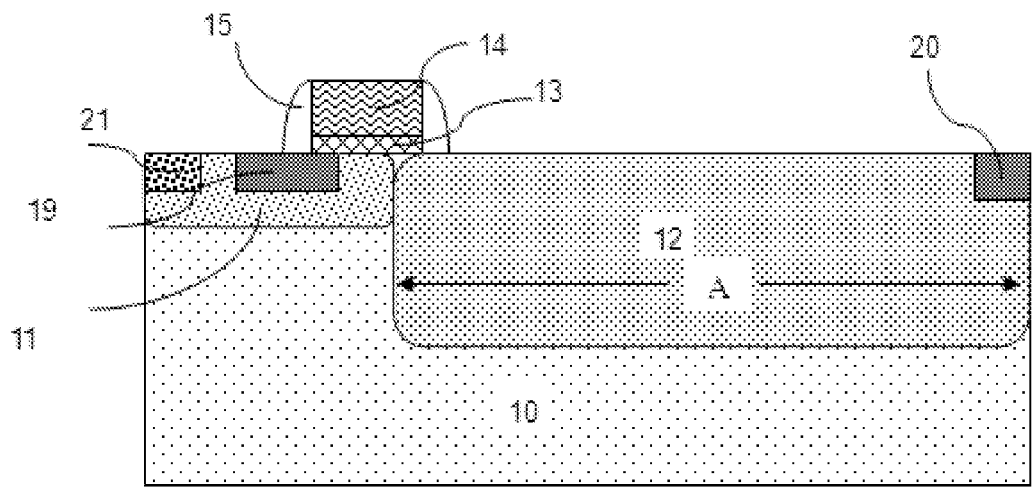
FIG. 1a shows a schematic illustration of a vertical cross section of an existing n-type non-channel-isolated LDMOS device.
Figure 1B:
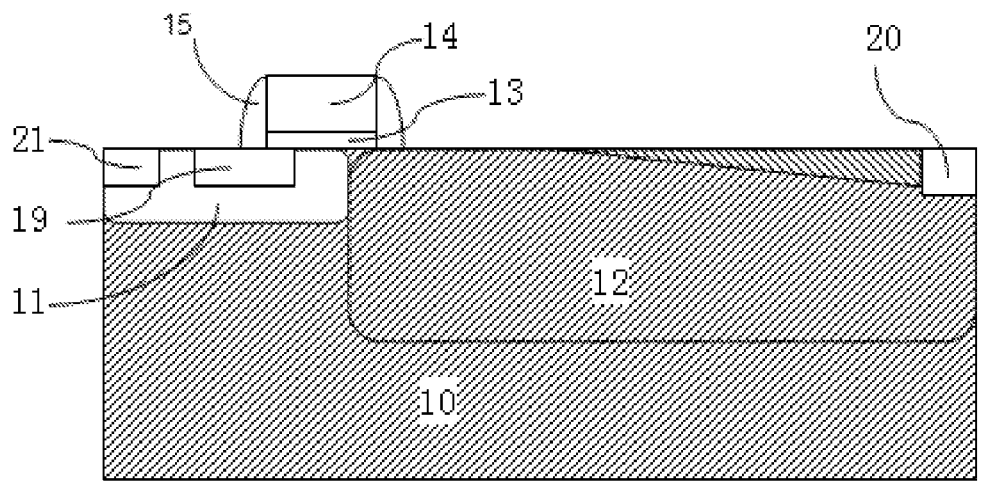
FIG. 1b shows a diagram schematically illustrating the charge distribution in a depletion region of the LDMOS device of FIG. 1a when an avalanche breakdown occurs.

FIG. 1b shows a diagram schematically illustrating the charge distribution in a depletion region of the existing non-channel-isolated LDMOS device of FIG. 1a when an avalanche breakdown occurs. The depletion region (i.e. left diagonal filled region shown in FIG. 1b) encloses the p-type substrate (or epitaxial layer) 10 and a portion of the n-type drift region 12. When an avalanche breakdown occurs to the existing n-type LDMOS device shown in FIG. 1a, the channel of the device will cause the depletion region horizontally extend towards the drain region 20. Moreover, a PN junction formed between the n-type drift region 12 and the p-type substrate (or epitaxial layer) 10 will cause the depletion region vertically extend towards the p-type substrate (or epitaxial layer) 10. As both the horizontal and vertical dimensions of the depletion region are determined by, and reversely proportional to, the doping concentration of the drift region 12, a heavily doped drift region 12 will not be completely depleted even upon the occurrence of the device's avalanche breakdown. As shown in FIG. 1b, a triangular region (i.e. right diagonal filled region) proximate the drain region 20 and under the top surface of the drift region 12 is not depleted after the avalanche breakdown of the device. The existence of this triangular region causes the effective length of the drift region to be smaller than the physical length (i.e., the length A shown in FIG. 1a) of the drift region, thereby centralizing electric field in the drift region 12 and creating an intensively high electric field therein, which lead to a reduced breakdown voltage of the device.

The existing non-channel-isolated p-type LDMOS devices and channel-isolated n-type LDMOS devices all have the problem that the drift region cannot be completely depleted.

Figure 2A:
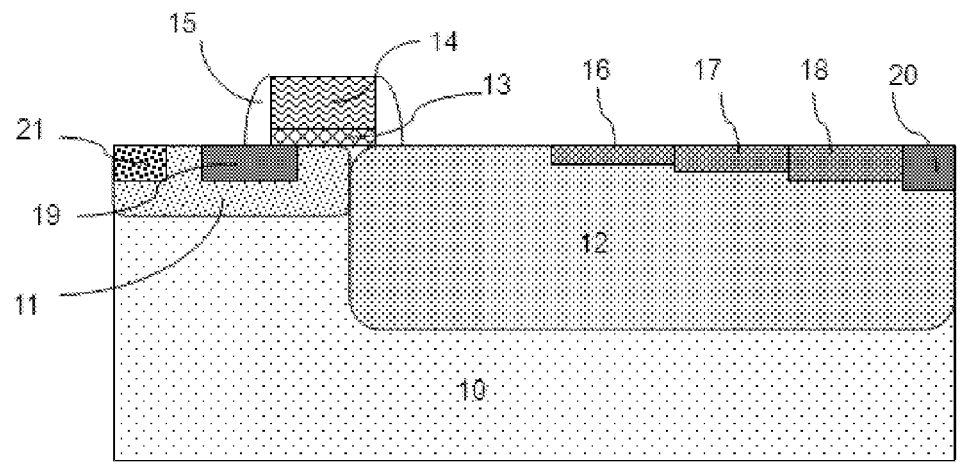
FIG. 2a shows a schematic illustration of a vertical cross section of an n-type non-channel-isolated LDMOS device embodying the present invention.

FIG. 2a schematically illustrates a non-channel-isolated n-type LDMOS device embodying the present invention. The device includes a p-type doped region 11 and an n-type drift region 12, laterally neighboring each other and both formed in a p-type substrate (or epitaxial layer) 10. The n-type drift region 12 has a planar top surface. A heavily doped n-type source region 19 is formed in a central portion of the p-type doped region 11. A gate oxide layer 13 has its one end on the n-type drift region 12, the other end on the heavily doped n-type source region 19, and the rest portion on the p-type doped region 11. A gate 14 is located on the gate oxide layer 13. Sidewalls 15 are formed on both sides of the gate oxide layer 13 and the gate 14. A heavily doped n-type drain region 20 is formed at one end of the n-type drift region 12 farther from the p-type doped region 11. A p-type heavily doped channel pick-up region 21 is formed at one end of the p-type doped region 11 farther from the n-type drift region 12. A channel of the LDMOS device is formed in a portion of the p-type doped region 11 under the gate oxide layer 13. The LDMOS device of the present invention differs from an existing LDMOS device in that a p-type buried layer is formed in the n-type drift region 12 and in close proximity to the n-type drain region 20. The p-type buried layer includes a first portion 16, a second portion 17 and a third portion 18; a depth of the p-type buried layer decreases progressively in a direction from the n-type drain region 20 to the p-type doped region 11, and accordingly, a thickness of the n-type drift region 12 increases progressively in the direction from the n-type drain region 20 to the p-type doped region 11, so that the n-type drift region 12 will be always completely depleted during the operation of the LDMOS device.

FIG. 2a schematically shows an example of the p-type buried layer having three portions 16, 17, and 18. It shall be appreciated that the number of portions included in the p-type buried layer may be reduced to two portions or increased to four or more portions, which are all within the scope of the present invention.

The above-mentioned device is a non-channel-isolated LDMOS device, which may be modified into a channel-isolated n-type LDMOS device by including an n-type well in the p-type substrate (or epitaxial layer) 10, encircling both the p-type doped region 11 and the n-type drift region 12, and remaining the same structure and conductivity type of all the rest components of the n-type LDMOS device shown in FIG. 2a.

Similarly, the n-type LDMOS device in FIG. 2a may be modified into a p-type LDMOS device by including an n-type well in the p-type substrate (epitaxial layer) 10, encircling both an n-type doped region 11' and a p-type drift region 12', and converting the conductivity types of all the rest components of the n-type LDMOS device to respective opposite types of conductivity.

The progressively decreasing thickness from the channel towards the drain region of the step-like drift region of the LDMOS device of the present invention enables a portion of the drift region, which is more proximate to the channel and is hence easier to be depleted, to have a greater thickness and a portion, which is farther from the channel and is thus more difficult to be depleted, to have a smaller thickness. As such, regardless of how high the doping concentration of the drift region is, the drift region may be always completely depleted during the operation of the LDMOS device. Moreover, as the doping concentration of the drift region, the operation voltage and the breakdown voltage of the LDMOS device are known factors during the design and manufacturing of the device, and therefore, the decreasing thicknesses of the drift region can be easily calculated, and accordingly, the increasing depths of the buried layer can be obtained.

The buried layer of the LDMOS device embodying the present invention shown in FIG. 2a shall not be in close proximity to the channel of the LDMOS device. Preferably, a certain spacing is left between the buried layer and the channel. The maximum depth of the buried layer has no direct relationship with the depth of the heavily doped drain region. The maximum depth of the buried layer may be greater than, equal to, or smaller than the depth of the heavily doped drain region. Moreover, when the doping concentration of the drift region is high, the end of the buried layer (i.e., the end nearer to the gate oxide layer 13) shall be closer to the heavily doped drain region, and at the same time, the depth of each portion of the buried layer shall be greater. This is because a drift region with a higher doping concentration is more difficult to be depleted, and thus requires a deeper buried layer to help the drift region to be depleted. Once the doping concentration of the drift region is set, regardless of how many portions the buried layer has, the depth of the portion closest to the heavily doped drain region is determined, that is to say, the maximum depth of the buried layer is only determined by the doping concentration of the drift region.

Figure 2B:
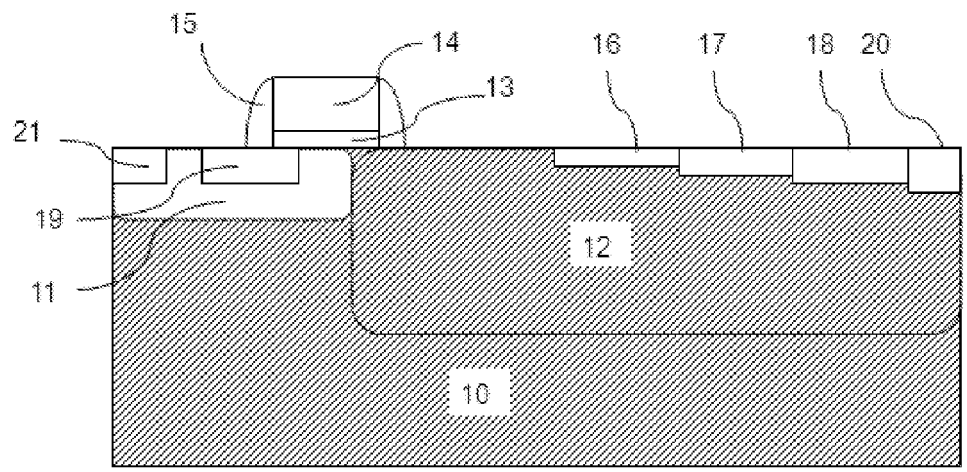
FIG. 2b shows a diagram schematically illustrating the charge distribution in a depletion region of the LDMOS device of FIG. 2a when a high voltage is applied to a drain region of the device.

FIG. 2b shows a diagram schematically illustrating the charge distribution in a depletion region of the n-type non-channel-isolated LDMOS device embodying the present invention when a high voltage is applied to a drain region of the device. The depletion region (i.e. left diagonal filled region shown in FIG. 2b) encloses the p-type substrate (or epitaxial layer) 10 and the entire step-like n-type drift region 12. This is because a buried layer (having three portions 16, 17, and 18) is formed beneath a top surface of the n-type drift region 12 and in close proximity to the heavily doped drain region 20, causing the thickness of the n-type drift region 12 to decrease progressively in a direction from the channel to the heavily doped drain region 20. This structure enables a portion of the n-type drift region 12, which is closer to the channel and is hence easier to be depleted, to have a greater thickness and a portion, which is closer to the heavily doped drain region 20 and is thus more difficult to be depleted, to have a smaller thickness. As such, the n-type drift region 12 can be completely depleted during the operation of the LDMOS device, and the effective length of the drift region is equal to the physical length of the drift region, thereby creating an evenly distributed electric field in the drift region 12 and greatly reducing the electric field therein, which lead to an increased breakdown voltage of the device. Moreover, by adopting the structure of the LDMOS device embodying the present invention, the doping concentration of the drift region can be increased to a certain extent, so as to achieve a lower on-resistance under the premise of a slightly reduced breakdown voltage of the device, and hence can achieve a balance of the two technology characteristics In one exemplary embodiment, the non-channel-isolated n-type LDMOS device shown in FIG. 2a may be fabricated by a method described below.

Figure 3A:
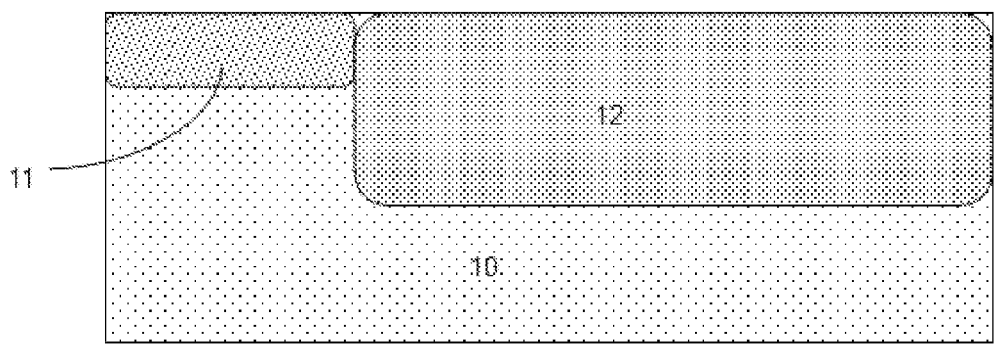
FIGS. 3a to 3f show schematic illustrations of device structures after steps of a method for fabricating an n-type LDMOS device (non-channel-isolated) in accordance with an embodiment of the present invention.

Turning now to FIG. 3a, in step 1 of the method, a p-type doped region 11 and an n-type drift region 12 adjacent to each other are formed, by ion implantation, in a p-type substrate 10. Preferably, multiple ion implantation and annealing processes are carried out to form a dopant concentration gradient in the drift region 12 decreasing from the top down. The dopant concentration gradient enables the LDMOS device being fabricated to have a low on-resistance and facilitates the drift region 12 to be completely depleted to achieve a high breakdown voltage of the device. Preferably, the drift region has a dopant concentration of $1 \times 10^{16}$ atoms/cm$^3$ to $1 \times 10^{18}$ atoms/cm$^3$.

Figure 3B:
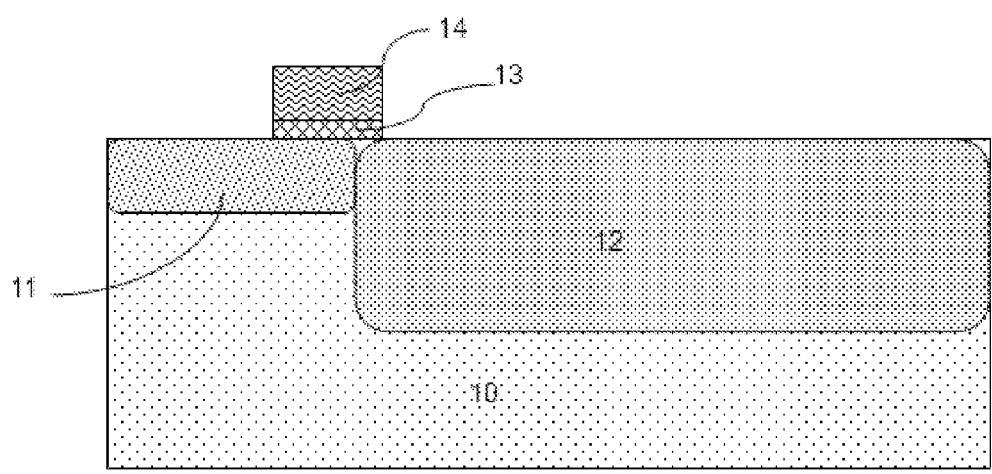

In step 2, as shown in FIG. 3b, a silicon oxide layer is thermally grown or deposited over the substrate, and a polysilicon layer is further deposited over the silicon oxide layer. Next, photolithography and etching processes are performed on the silicon oxide layer and the polysilicon layer to form a gate oxide layer 13 and a polysilicon gate 14 on the gate oxide layer 13. The gate oxide layer 13 has one end on the p-type doped region 11 and the other end on the n-type drift region 12, namely it crosses the border of the p-type doped region 11 and the n-type drift region 12.

Figure 3C:
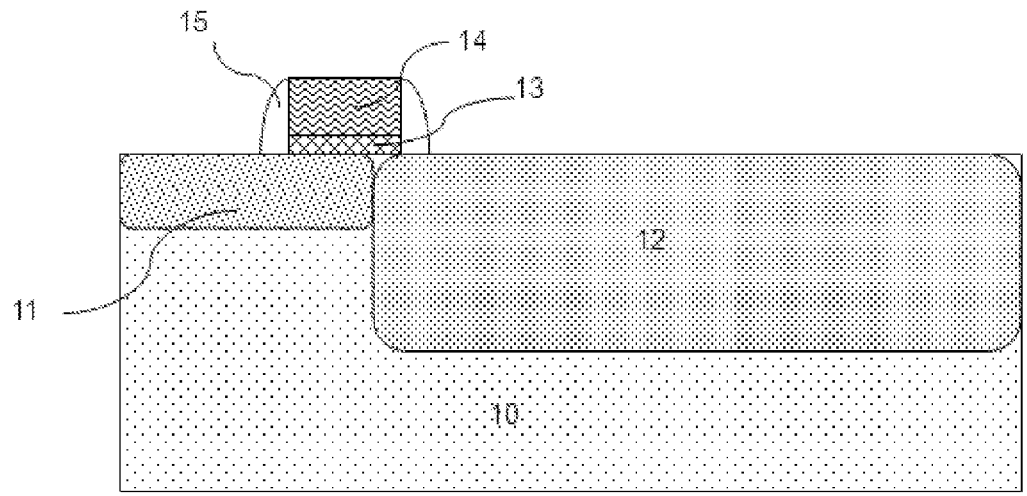

In step 3, as shown in FIG. 3c, a layer of a dielectric material, for example, silicon nitride, is deposited over the resulting structure after the second step. Next, undesirable portions of the layer are removed by a dry etching process and the remaining portions form sidewalls 15 on both sides of the gate oxide layer 13 and the polysilicon gate 14.

Figure 3D:
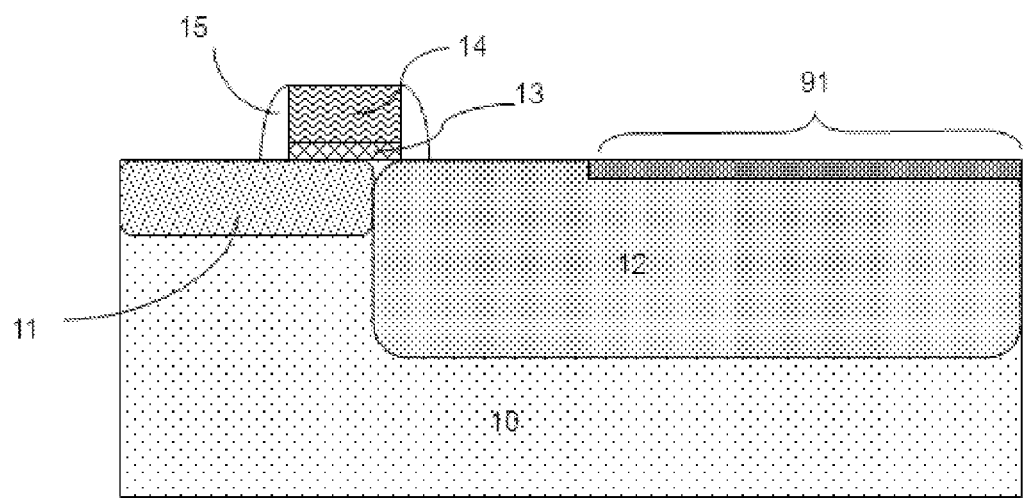

In step 4a, as shown in FIG. 3d, an ion implantation process is performed on the n-type drift region 12 to form a first ion implantation region 91 therein. The first ion implantation region 91 is located at an end of the n-type drift region 12 that is farther from the gate oxide layer 13 and may be in close proximity to the border of the n-type drift region 12.

Figure 3E:
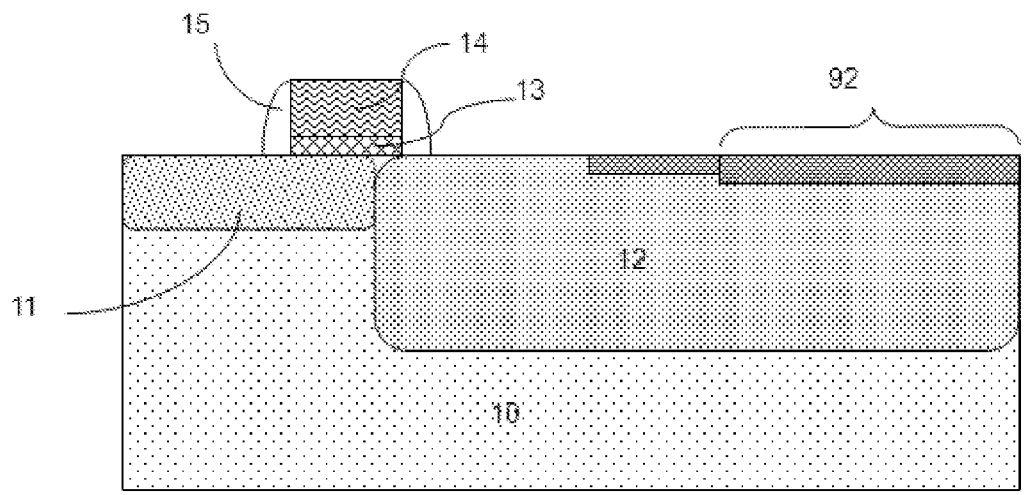

In step 4b, as shown in FIG. 3e, a second ion implantation process is performed in the first ion implantation region 91 to form a second ion implantation region 92 therein at the end of the first ion implantation region 91 that is farther from the gate oxide layer 13. The second ion implantation region 92 may be shorter than the first ion implantation region 91 and the second ion implantation region 92 may have a depth greater than that of the first ion implantation region 91.

Figure 3F:
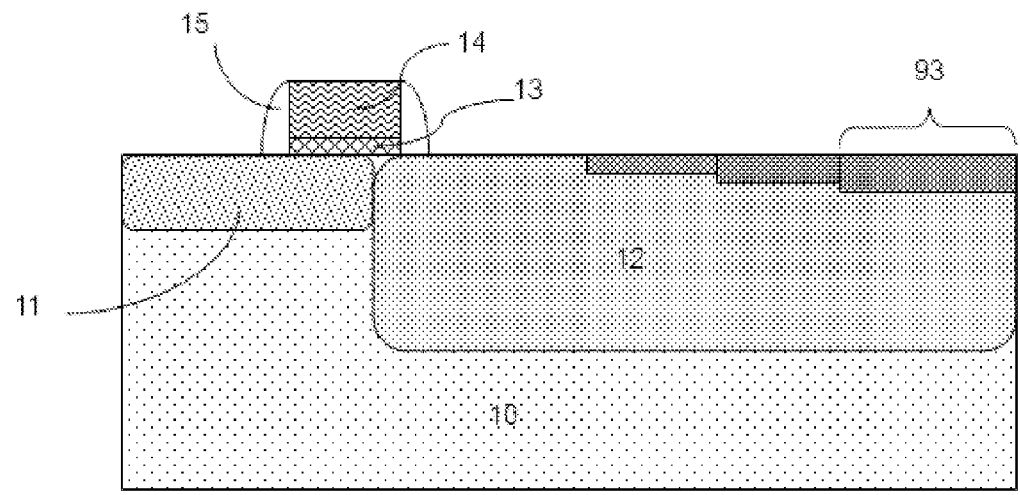

In step 4c, as shown in FIG. 3f, a third ion implantation process is performed in the second ion implantation region 92 to form a third ion implantation region 93 therein at the end of the second ion implantation region 92 that is farther from the gate oxide layer 13. The third ion implantation region 93 may be shorter than the second ion implantation region 92 and the third ion implantation region 93 may have a depth greater than that of the second ion implantation region 92.

With further reference to FIG. 2a, in step 5 of the method, an ion implantation process is performed on a portion of the p-type doped region 11 that is in close proximity to the sidewall 15 to form a heavily doped n-type source region 19 therein. Next, an annealing process is performed to cause the heavily doped n-type source region 19 to diffuse into a central portion of the p-type doped region 11. As such, one end of the gate oxide layer 13 is now on the heavily doped n-type source region 19. Moreover, a region between the heavily doped n-type source region 19 and the n-type drift region 12, under the gate oxide layer 13, serves as a channel of the LDMOS device being fabricated.

After that, an ion implantation process is performed at an end of the n-type drift region 12 that is farther from the gate oxide layer 13 to form a heavily doped n-type drain region 20 therein. Or in other words, an ion implantation process is performed in the third ion implantation region 93 at an end farther from the gate oxide layer 13 to form the heavily doped n-type drain region 20 therein.

Moreover, an ion implantation process is performed at an end of the p-type doped region 11 that is farther from the gate oxide layer 13 to form a heavily doped p-type channel pick-up region 21 therein.

The above steps 4a to 4c merely show an example of forming a buried layer, which can be changed according to the number of portions included in the buried layer.

Preferably, both the heavily doped source region 19 and the heavily doped drain region 20 have a dopant concentration of greater than $1\times10^{20}$ atoms/cm$^3$. Moreover, the heavily doped channel pick-up region 21 may have the same dopant concentration with the above two regions 19, 20.

Although the sidewalls are formed in step 3 before the steps 4a to 4c in this embodiment, the present invention may also be employed with the sidewalls formed after, or even among, the steps 4a to 4c.

As described above, each implantation process in the step 1 and the implantation process in the step 5 are all followed by an annealing process. Preferably, each annealing process in the step 1 is a high-temperature furnace annealing process and the annealing process in the step 5 is a rapid thermal annealing (RTA) process.

With reference to FIG. 2a, FIG. 3d, FIG. 3e, and FIG. 3f, the second ion implantation region 92 is formed within the first ion implantation region 91, and the third ion implantation region 93 is formed within the second ion implantation region 92, so as to form a buried layer including a first portion 16, a second portion 17 and a third portion 18 which are laterally adjacent to each other as shown in FIG. 2a. The first portion 16 is a portion of the first ion implantation region 91 that is not covered by the second ion implantation region 92; the second portion 17 is a portion of the second ion implantation region 92 that is not covered by the third ion implantation region 93; the third portion 18 is a portion of the third ion implantation region 93 that is not covered by the n-type heavily doped drain region 20.

Alternatively, with reference to FIG. 2a, there is another method for forming the buried layer, that is, by multiple ion implantation processes, a portion of the buried layer is formed by each corresponding ion implantation process and depths of portions of the buried layer decrease progressively in a direction from the n-type heavily doped drain region 20 to the channel. Preferably, a third portion 18 of the buried layer in close proximity to the n-type heavily doped drain region 20 is firstly formed; a second portion 17 of the buried layer, having a smaller depth than the third portion 18, in close proximity to the third portion 18 is then formed; and a first portion 16, having a smaller depth than the second portion 17, in close proximity to the second portion 17 is finally formed.

In one embodiment, the step 1 of the above method may be modified as: first forming an n-well (not shown) in a p-type substrate (epitaxial layer) 10 by ion implantation, and then forming an n-type doped region 11' and a p-type drift region 12' laterally adjacent to each other in the n-well, and following all subsequent steps with the opposite types of conductivity as described in the method, a non-channel-isolated p-type LDMOS device in accordance with the present invention is fabricated.

In yet another embodiment, the step 1 of the above method may be modified as: first forming an n-well (not shown) in a p-type substrate (epitaxial layer) 10 by ion implantation, and then forming a p-type doped region 11 and an n-type drift region 12 laterally adjacent to each other in the n-well, and following all subsequent steps with the same types of conductivity as described in the method, a channel-isolated n-type LDMOS device in accordance with the present invention is fabricated.

While preferred embodiments are described and illustrated above, they are not intended to limit the invention in any way. Those skilled in the art can make various alternatives, modifications and variations without departing from the scope of the invention. Thus, it is intended that the present invention embrace all such alternatives, modifications and variations as fall within the true scope of the invention.

What is claimed is:

1. A laterally diffused metal oxide semiconductor (LDMOS) device comprising:
    a substrate having a first type of conductivity;
    a drift region having a second type of conductivity and being formed in the substrate;
    a doped region having the first type of conductivity and being formed in the substrate, the doped region being laterally adjacent to the drift region;
    a drain region having the second type of conductivity and being formed in the drift region, the drain region being located at an end of the drift region farthest from the doped region; and
    a buried layer having the first type of conductivity and being formed in the drift region, the buried layer continuously extending along a straight line in a direction from the drain region to the doped region and having an end in close proximity to the drain region, the buried layer having a continuous and substantially flat upper surface along the straight line and a step-like bottom surface, and wherein a maximum depth of the buried layer decreases progressively along the straight line in the direction from the drain region to the doped region.

2. The LDMOS device according to claim 1, wherein the first and second types of conductivity are p-type and n-type, respectively, or n-type and p-type, respectively.

3. The LDMOS device according to claim 1, wherein a maximum depth of the buried layer is determined by a doping concentration of the drift region.

4. The LDMOS device according to claim 1, wherein the buried layer comprises at least two laterally connected sections and wherein a maximum depth of the at least two laterally connected sections decreases progressively in the direction from the drain region to the doped region.

5. The LDMOS device according to claim 1, further comprising:
    a gate oxide layer and a polysilicon gate both on a top surface of the substrate, the gate oxide layer covering a portion of the drift region and a portion of the doped region;
    sidewalls on opposite sides of the gate oxide layer and the polysilicon gate; and
    a heavily doped source region having the second type of conductivity and a heavily doped channel pick-up region having the first type of conductivity both formed in the doped region, the heavily doped channel pick-up region being located at an end of the source region farthest from the drift region.

* * * * *